United States Patent
Jairazbhoy et al.

(10) Patent No.: US 6,992,887 B2
(45) Date of Patent: Jan. 31, 2006

(54) LIQUID COOLED SEMICONDUCTOR DEVICE

(75) Inventors: Vivek A. Jairazbhoy, Farmington Hills, MI (US); Prathap A. Reddy, Farmington Hills, MI (US); John Trublowski, Troy, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 278 days.

(21) Appl. No.: 10/685,979

(22) Filed: Oct. 15, 2003

(65) Prior Publication Data

US 2005/0083652 A1  Apr. 21, 2005

(51) Int. Cl.
H05K 7/20 (2006.01)

(52) U.S. Cl. .................. 361/689; 361/688; 361/704; 361/720; 165/80.3; 165/104.33; 257/713; 174/252

(58) Field of Classification Search ........ 361/687–689, 361/690, 697–699, 704, 705, 717, 719, 720–724; 165/80.2, 80.3, 104.32, 104.33, 133, 185; 257/706–727, 731, 789, 796, 678; 62/259.2; 174/16.3, 252, 200; 29/890.03, 521, 557, 29/505, 840
See application file for complete search history.

(56) References Cited

U.S. PATENT DOCUMENTS

| | | | |
|---|---|---|---|
| 2,942,165 A * | 6/1960 | Jackson et al. ............. | 257/714 |
| 4,012,770 A | 3/1977 | Pravda et al. | |
| 4,106,188 A | 8/1978 | Sekhon et al. | |
| 4,381,818 A | 5/1983 | Sachar et al. | |
| 4,995,451 A | 2/1991 | Hamburgen | |
| 5,150,274 A | 9/1992 | Okada et al. | |
| 5,210,440 A | 5/1993 | Long | |
| 5,262,921 A | 11/1993 | Lamers | |
| 5,349,498 A | 9/1994 | Tanzer et al. | |
| 5,448,108 A | 9/1995 | Quon et al. | |
| 5,455,458 A * | 10/1995 | Quon et al. ............. | 257/714 |
| 5,606,201 A | 2/1997 | Lutz | |
| 5,780,928 A | 7/1998 | Rostoker et al. | |
| 5,880,524 A | 3/1999 | Xie | |
| 5,966,291 A * | 10/1999 | Baumel et al. ............. | 361/707 |
| 5,986,885 A | 11/1999 | Wyland | |
| 6,016,007 A * | 1/2000 | Sanger et al. ............. | 257/714 |
| 6,037,658 A | 3/2000 | Brodsky et al. | |
| 6,055,154 A * | 4/2000 | Azar ............. | 361/688 |

(Continued)

FOREIGN PATENT DOCUMENTS

EP  559 092  9/1993

Primary Examiner—Michael Datskovskiy
(74) Attorney, Agent, or Firm—Brinks Hofer Gilson & Lione

(57) ABSTRACT

A liquid cooled semiconductor device is provided. The device includes a semiconductor die, a heat spreader, a wetting material, a sealant, a substrate, and a base. The spreader is mounted to a substrate such that a first side of the spreader is exposed on one side of the substrate and that a second side of the spreader is exposed on an opposing side of the substrate. Attached to a first side of the spreader is the semiconductor die. The wetting material is used to provide a thermal/electrical connection between the die and heat spreader. Sealant is provided between the die and the heat spreader to encapsulate and contain the wetting material. The substrate is mounted to the base, whereby the second side of the spreader is exposed to allow fluid to flow across the second side, directed within a channel defined by the base, and transfer heat away from the spreader.

19 Claims, 2 Drawing Sheets

U.S. PATENT DOCUMENTS

| | | | |
|---|---|---|---|
| 6,141,219 A * | 10/2000 | Downing et al. | 361/704 |
| 6,397,450 B1 | 6/2002 | Ozmat | |
| 6,400,012 B1 | 6/2002 | Miller et al. | |
| 6,414,867 B2 * | 7/2002 | Suzuki et al. | 363/141 |
| 6,424,531 B1 | 7/2002 | Bhatti et al. | |
| 6,473,303 B2 * | 10/2002 | Kaufmann | 361/699 |
| 6,535,388 B1 | 3/2003 | Garcia | |
| 6,594,149 B2 * | 7/2003 | Yamada et al. | 361/699 |
| 6,892,796 B1 * | 5/2005 | Nagashima et al. | 165/80.4 |
| 6,937,471 B1 * | 8/2005 | Haws et al. | 361/699 |
| 2003/0133268 A1 | 7/2003 | Radosevich et al. | |

* cited by examiner

LIQUID COOLED SEMICONDUCTOR DEVICE

BACKGROUND

1. Field of the Invention

The present invention generally relates to a system for dissipating heat from a power module. More specifically, the invention relates to a system including a liquid cooled thermal stack for dissipating heat from a power module.

2. Description of Related Art

In high power electronic applications, such as electrical vehicle applications, a significant amount of heat is generated in a semiconductor device that controls the switching of power. The heat adversely affects the performance and reliability of the device by causing the device to overheat. When the device overheats, the junction temperature rises to a level where the device can fail to function. In addition, the devices and interconnects may also fail due to thermal expansion effects causing solder joint cracking. Therefore, it is advantageous to maximize in the device the capability to dissipate heat and to minimize the effects of thermal expansion.

One approach, as seen in FIG. 1, has been to use a direct bond copper (DBC) substrate. One example is illustrated by power module 10. The power module 10 includes a die 12, a DBC substrate 14, a heat spreader 20, and water 30 for cooling. The die 12 is attached to the DBC substrate 14 by a solder layer 16. A wire bond 26 attaches the die 12 to a bond pad 28 on the DBC substrate 14. The DBC substrate includes three layers, a top copper layer 15, followed by a middle aluminum nitride layer 17, and a bottom, third copper layer 19. Provided as such, the DBC substrate 14 provides a solderable, dielectric substrate for the die 12. In addition, the aluminum nitride layer 17 is dielectric with a coefficient of thermal expansion (CTE) closely matched to the silicon of the die 12.

The DBC substrate 14 is attached to the heat spreader 20 by the solder layer 18. Made of copper, the heat spreader 20 is attached to a layer of thermal grease 22 to a cold plate 24.

Fluid 30 is directed to flow across the copper cold plate 24 to transport the heat away from the power module 10, the fluid 30 is directed by a channel 32 defined by a first wall 34 and a second wall 36. An aperture 35 is formed in the first wall 34 of the channel 32 and the cold plate 24 is attached to the first wall 34 over the aperture 35. Provided with the aperture 35, the first wall 34 allows the water 30 to directly contact the cold plate 24 and dissipate heat. To seal the water 30 in the channel 32 a gasket 38 is provided between the first wall 34 and the cold plate 24.

Unfortunately, the DBC substrate 14 is not optimized for sinking heat from the die and may not provide optimal reliability. For example, the solder and thermal grease interfaces 18 and 22 may increase the thermal resistance of the thermal stack. In addition, stress due to thermal expansion mismatch of the copper with die 12 will be concentrated at the solder interfaces, which may result in failures in the solder. The advantage in using the DBC substrate includes using the substrate to support the electronic circuit since it has dielectric properties. Disadvantages of DBC include cost, low thermal conductivity, and difficulty of manufacturability.

In view of the above, it is apparent that there exists a need for an improved system for providing thermal dissipation of heat from semiconductor dies in high power electronic applications.

SUMMARY

In satisfying the above need, as well as overcoming the enumerated drawbacks and other limitations of the related art, the present invention provides a system for dissipating heat from a semiconductor device. The system generally includes a semiconductor die, a heat spreader, a wetting material, a sealant, a substrate, and a base.

As is typical thereof, the semiconductor die produces heat in normal operation. To dissipate this heat, the semiconductor die is attached to a first side of the heat spreader. The wetting material, which may be a liquefiable solder, is used to provide a thermal connection between the die and heat spreader. The sealant provides a mechanical connection between the die and heat spreader, in addition to encapsulating the wetting material. The heat spreader is further attached to a substrate configured for fixing the location of the heat spreader. A second side of the heat spreader is exposed from the substrate and configured to allow cooling fluid to flow thereacross transferring heat away from the heat spreader.

In other aspects, the substrate includes a plastic material and the heat spreader is insert molded into the plastic material for ease of manufacture. The heat spreader can also include copper to facilitate heat transfer. To prevent electrical shorting, the cooling fluid may be a dielectric fluid. Alternatively, the heat spreader may include a ceramic dielectric coating sputtered on the second side of the heat spreader allowing an electrolizable fluid such as water to be used. The fluid is directed to flow across the second side of the heat spreader by a channel. The channel is configured to contain the fluid and may include a seal or gasket located between the channel and the substrate.

Further objects, features and advantages of this invention will become readily apparent to persons skilled in the art after a review of the following description, with reference to the drawings and claims that are appended to and form a part of this specification.

DETAILED DESCRIPTION

Figure 1:
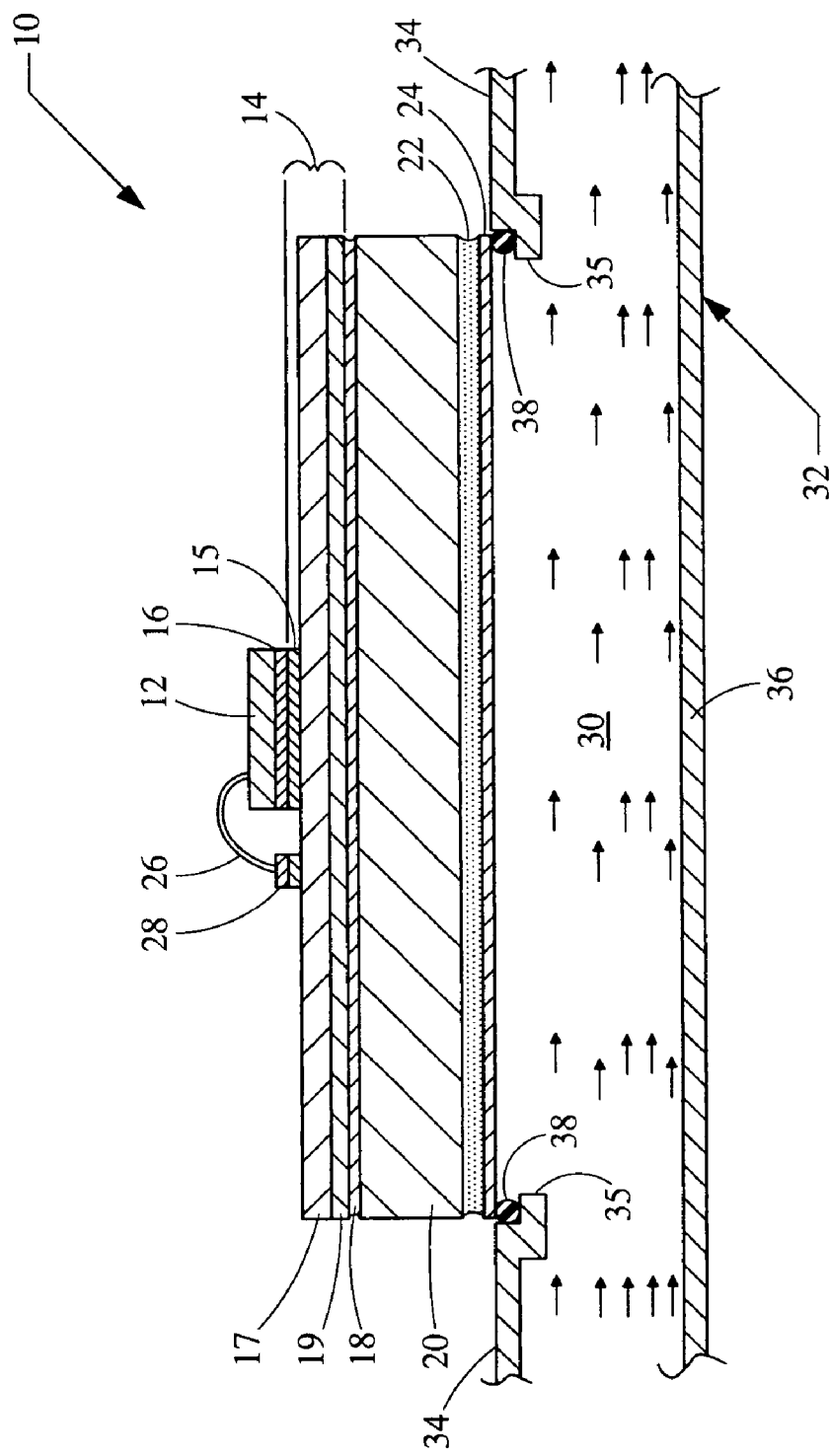
FIG. 1 is a sectional view of a power module used in high power electronic applications according to the prior art.
Figure 2:
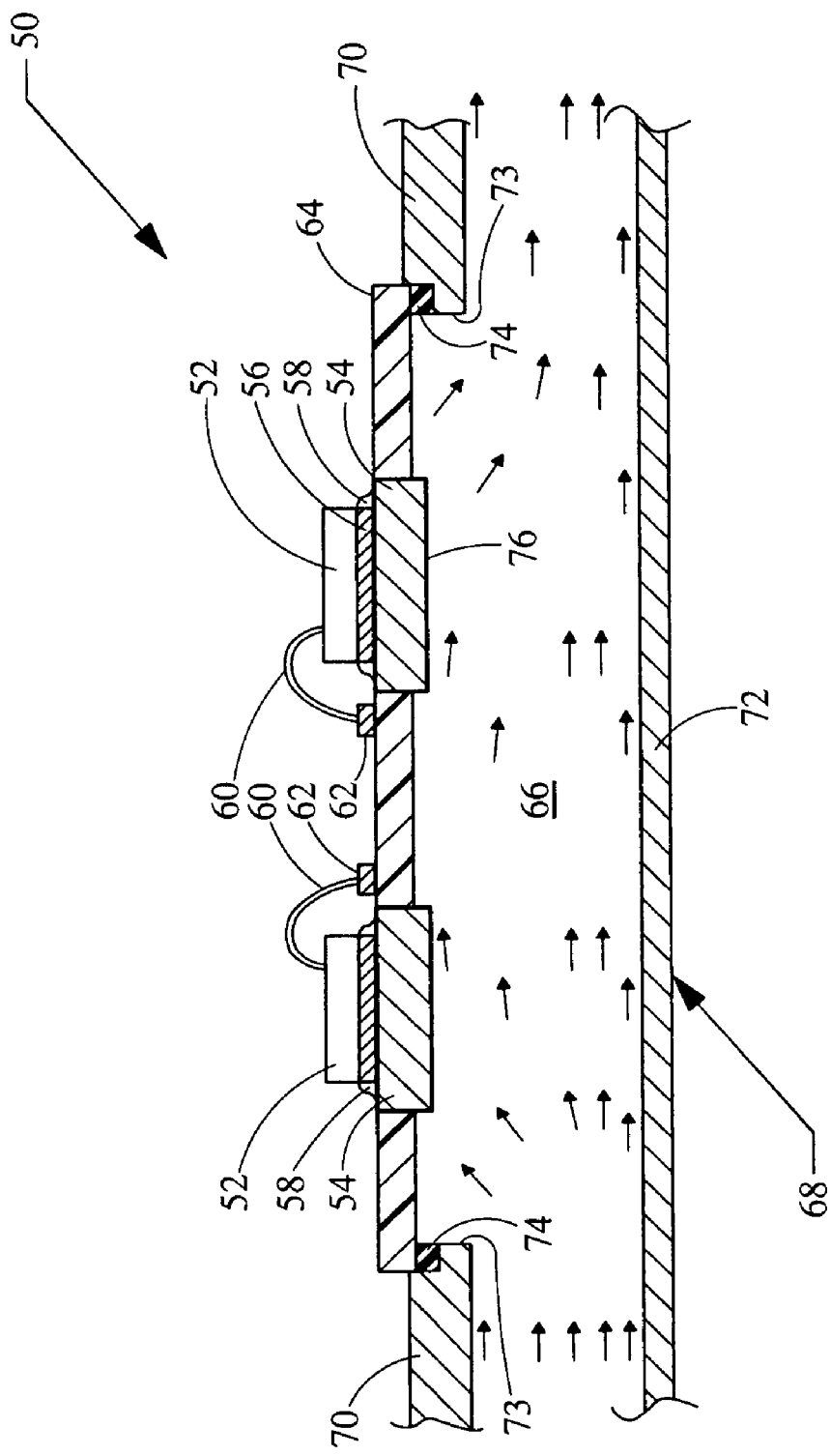
FIG. 2 is a sectional view of a power module for high power electronic applications according to the present invention.

Now referring to FIG. 2, a system embodying the principles of the present invention is illustrated therein and generally designated at 50. The system 50 includes as its principal components a semiconductor die 52, wetting material 56, sealant 58, a heat spreader 54, a fluid 66 and a base 68.

The die 52 is attached to a copper heat spreader 54 without an intermediate dielectric layer. Attachment is made by means of a stress relieving interconnect comprising a wetting material 56 and sealant 58. The wetting material 56 is a phase changing solder that provides an electrical connection between the die 52 and the heat spreader 54, that softens or liquefies during the thermal cycle thus relieving accumulated stress. The sealant 58, which may include an encapsulant adhesive material and has suitable strength and thermal expansion properties to confine the electrical interconnect material and provide mechanical attachment between the die 52 and the heat spreader 54. The heat spreader 54 is fixed in place by the substrate 64. A wire bond 60 attaches the die 52 to a bond pad 62 on the DBC substrate.

A side of the heat spreader 54 is exposed through an aperture in the substrate 64 allowing cooling fluid 66 to flow across the heat spreader 54 and transport heat away from the power module 50. Due to the continuous electrical connection between the die 52 and the heat spreader 54, the fluid 66 may be a dielectric fluid to prevent shorts. Alternatively, a dielectric coating 76 may be applied to the exposed side of the heat spreader 54, providing electrical insulation between the heat spreader 54 and the fluid 66. The coating 76 may be a ceramic coating that is sputtered on the exposed side of the heat spreader. Use of the dielectric coating 76 allows an electrolizable fluid to be used for cooling the heat spreader 54, including water.

A base 68 with a first wall 70 and a second wall 72 forms a channel provided for directing the flow of a cooling fluid 66. The first wall 70 includes an aperture 73 where the substrate 64 is attached, thererby allowing the fluid 66 to directly contact the heat spreader 54. The heat spreader 54 is exposed from a face of substrate 64 to the coolant path of the cooling fluid 66.

Alternatively, the dielectric substrate 64 can be plastic allowing the heat spreaders to be insert molded at the desired locations, with one surface exposed for die attach, and another surface exposed to the coolant path. Provided between the first wall 70 and the substrate 64, the gasket 74 seals the fluid 66 in the base 68. Further, the substrate 64 can form a portion of the channel that transports the fluid 66.

As a person skilled in the art will readily appreciate, the above description is meant as an illustration of implementation of the principles this invention. This description is not intended to limit the scope or application of this invention in that the invention is susceptible to modification, variation and change, without departing from spirit of this invention, as defined in the following claims.

We claim:

1. A fluid cooled semiconductor device comprising:
   a semiconductor die;
   a heat spreader having a first side and a second side, the first side being attached to the semiconductor die;
   a wetting material providing a thermal connection between the semiconductor die with the heat spreader;
   a sealant extending between the semiconductor die and the heat spreader and encapsulating the wetting material;
   a substrate to which the spreader is mounted, the spreader being mounted to the substrate such that at least part of the second surface of the spreader is exposed from the substrate; and
   a base including wall portions defining a channel adapted to having cooling fluid flow through the channel, part of the wall portions defining an aperture and the substrate being mounted over the aperture such that the second surface of the spreader will be contacted by a flow of the cooling fluid through the channel.

2. The device according to claim 1, wherein the wetting material is a liquefiable solder.

3. The device according to claim 1, wherein the substrate includes a plastic material.

4. The device according to claim 3, wherein the heat spreader is insert molded into the substrate.

5. The device according to claim 1, wherein the heat spreader is constructed primarily of copper.

6. The device according to claim 1, wherein the heat spreader includes a dielectric coating on the second side of the heat spreader.

7. The device according to claim 6, wherein the coating is a ceramic coating.

8. The system according to claim 1, wherein the fluid is an electrolizable fluid.

9. The device according to claim 1, further comprising a fluid tight seal located about the aperture and between the substrate and the base.

10. A fluid cooled semiconductor device comprising:
    a semiconductor die;
    a heat spreader having a first and a second side, the first side being attached to the semiconductor die;
    a liquefiable solder providing a thermal connection between the die and the heat spreader;
    a sealant extending between the die and the heat spreader, and encapsulating the liquefiable solder;
    a plastic substrate for fixing the location of the heat spreader, wherein the heat spreader is insert molded into the plastic substrate such that the second side of the heat spreader is exposed from the substrate; and
    a base including wall portions defining a channel adapted to having cooling fluid flow through the channel, part of the wall portions defining an aperture and the substrate being mounted over the aperture such that the second surface of the spreader will be contacted by a flow of the cooling fluid through the channel.

11. The system according to claim 10, wherein the fluid is a dielectric fluid.

12. The system according to claim 10, wherein the heat spreader is a copper heat spreader.

13. The system according to claim 10, wherein the heat spreader includes a dielectric coating on the second side of the heat spreader.

14. The system according to claim 13, wherein the coating is a ceramic coating.

15. The system according to claim 13, wherein the ceramic coating is sputtered on the heat spreader.

16. The system according to claim 10, wherein the fluid is an electrolizable fluid.

17. The system according to claim 16, wherein the fluid includes water.

18. The system according to claim 10, further comprising a channel attached to the substrate, and the channel is configured to direct the fluid across the second side of the heat spreader.

19. The system according to claim 18, further comprising a seal located between the channel and the substrate.

* * * * *